United States Patent
Yoshikawa

(10) Patent No.: US 6,288,428 B1
(45) Date of Patent: Sep. 11, 2001

(54) SEMICONDUCTOR INTEGRATED CIRCUIT DEVICE FOR DISK DRIVE APPARATUS

(75) Inventor: Hiroshi Yoshikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/037,857

(22) Filed: Mar. 10, 1998

(30) Foreign Application Priority Data

Mar. 12, 1997 (JP) ..................................................... 9-057315

(51) Int. Cl.$^7$ ............................. H01L 29/06; H01L 29/90
(52) U.S. Cl. ........................ 257/355; 257/360; 257/361; 257/362
(58) Field of Search ............................ 257/355, 360, 257/361, 362

(56) References Cited

U.S. PATENT DOCUMENTS

| | | | |
|---|---|---|---|
| 5,493,133 | * 2/1996 | Duvvury et al. | 257/111 |
| 5,656,952 | * 8/1997 | McCall et al. | 326/82 |
| 5,805,396 | * 9/1998 | Sado et al. | 361/42 |
| 6,169,311 | * 1/2001 | Iwasaki | 257/358 |
| 6,204,537 | * 3/2001 | Ma | 257/360 |

* cited by examiner

Primary Examiner—Leo P. Picard
Assistant Examiner—Hung Van Duong
(74) Attorney, Agent, or Firm—Arent Fox Kintner Plotkin & Kahn, PLLC

(57) ABSTRACT

A semiconductor integrated circuit device for a magnetic drive apparatus has a driver for supplying an electric current to a motor including an inductance coil, a pad for receiving or outputting a signal from or to outside, and a protection diode connected to the pad. In this semiconductor integrated circuit device, the pad is disposed near the driver, and the protection diode is disposed at a predetermined distance from the driver.

24 Claims, 5 Drawing Sheets

SEMICONDUCTOR INTEGRATED CIRCUIT DEVICE FOR DISK DRIVE APPARATUS

BACKGROUND OF THE INVENTION

1. Field of the Invention

The present invention relates to a semiconductor integrated circuit device provided with a driver for supplying an electric current to a circuit that includes an inductance such as a stepping motor, and particularly to a semiconductor integrated circuit device for use in a disk drive apparatus.

2. Description of the Prior Art

As an example of such a semiconductor integrated circuit device, a description will be given on a semiconductor integrated circuit device for processing a head movement drive signal as well as to-be-recorded and read-out signals in a disk drive apparatus. This semiconductor integrated circuit device is provided with a stepper block for supplying an electric current to a stepping motor to move a magnetic head, a logic section for reading and writing data from and to a magnetic disk through the magnetic head, a signal path for connecting the logic section to a signal input pad, and a protection circuit for protecting the inside circuitry against a surge voltage that may be applied to the pad from outside. The protection circuit is usually composed of two diodes connected in series between the power source voltage and ground, with the node between them connected to the signal path (to the pad).

The stepper block has an output circuit that is composed of, for example, a first and a second transistor, both being of the NPN type. The first transistor has its collector connected to the power source voltage, and the second transistor has its emitter connected to ground. The emitter of the first transistor and the collector of the second transistor are connected via an output pad to the coil of the motor. Both transistors receive a drive voltage at their base. If the above-mentioned protection circuit is provided near this output circuit, the logic section may malfunction for the following reason. The current supplied to the stepping motor causes the inductance of the stepping motor to produce back electromotive force, which then makes the collector voltage of the second transistor lower than the ground level. This turns on the protection diode that is formed nearby, and thus causes the logic section to erroneously recognize receipt of, for example, a low-level signal and output a false control signal.

Next, a description will be given, with reference to FIG. 6, as to why the protection diode is turned on when the collector voltage of the second transistor becomes lower than the ground level. As shown in FIG. 6, on a P-type semiconductor substrate 69, P-type, N-type, insulating, and other layers are formed by impurity diffusion, epitaxial growth, or a similar method in the following manner. For a protection diode 54, an N⁺ layer 70 is provided on the substrate 69, and, on top of this N⁺ layer 70, an N layer 73 is provided. In addition, another N layer 71 is provided through the N layer 73. The two N layers 71 and 73 are of different concentration.

The N layer 71 is connected via an aluminum deposit 72 to a pad 58. Part of the N layer 73 is put in contact with a P layer 75 so that a PN junction of the diode is formed. The P layer 75 is connected via an aluminum deposit 81 to ground (GND).

Part of the N layer 73 is separated by an insulator 76. The P layer 75 is also provided with an insulator 77. In addition, insulating layers 78 to 80 are provided on the top surface for the separation of the aluminum deposits 72 and 81.

On the other hand, as an NPN-type transistor 131a for the output circuit of the stepper block, an N⁺ layer 85 is provided, as an embedding, on the P-type substrate 69. On top of this N⁺ layer 85, an N⁻ layer 87 is provided. Another N⁺ layer 86 is provided through the N⁻ layer 87 so as to contact the N⁺ layer 85, and, Ad on top of the N⁺ layer 86, an N layer 82 is provided.

The N layer 82 is connected via an aluminum deposit 88 to a pad 125, which is intended to be connected to the stepping motor. The symbol L represents the inductance component included in the stepping motor. The N layer 82 serves as the collector (C) terminal of the transistor 131a.

An insulator 95 is provided in the N⁻ layer 87 to separate the N⁺ layer 86 and the N layer 82 from a P layer 90. The P layer 90 includes, as part of itself, a P⁺ layer 89. An N⁺ layer 91 is provided in the P layer 90 so as not to contact the P⁺ layer 89. The P⁺ layer 89 and the P layer 90 serve as the base (B) of the transistor 131a, and are connected via a deposit 92 to a control circuit 33a.

The N⁺ layer 91 serves as the emitter (E) of the transistor 131a, and is connected via an aluminum deposit 93 to ground (GND). Insulators 94 to 96 and 76 are oxide films provided for the separation of circuit elements, and P layers 101, 102, and 75 are diffusion layers provided also for the separation of circuit elements. Insulating layers 78 to 80 and 97 to 100 are provided for the separation of deposits 88, 92, and 93.

Now, suppose that the inductance (L) of the stepping motor 2 has produced back electromotive force, thereby making the voltage at the collector (C) of the transistor 131a lower than the ground (GND) level.

In particular, when the voltage at the collector (C) of the transistor 131a is lower than the ground (GND) level by more than about 0.7 V (the forward voltage $V_F$), the parasitic transistor 60 (of the NPN type) hidden in the semiconductor integrated circuit device produces leak currents $I_1$ and $I_2$, which are approximately equal to each other, and these currents turn on the protection diode 54. As a result, as described previously, the logic section, by erroneously recognizing receipt of a low-level signal, is led to malfunction.

SUMMARY OF THE INVENTION

An object of the present invention is to provide a semiconductor integrated circuit device that operates stably without causing malfunctioning of an input/output protection circuit.

To achieve the above object, according to the present invention, in a semiconductor integrated circuit device intended for use in a magnetic recording apparatus and provided with a driver for supplying an electric current to a circuit including an inductance, a pad for receiving or outputting a signal from or to outside, and a protection diode connected to the pad, the pad is disposed near the drive in the protection diode is disposed at a predetermined distance from the driver.

In this construction, the pad is disposed near the driver, and the protection diode is disposed sufficiently away from the driver. The pad and the protection diode are connected by aluminum deposition or a similar method. The driver is connected to a circuit including an inductance such as a stepping motor. Even if the inductance produces back electromotive force, the placement of the protection diode away from the driver helps reduce the resulting leak currents to zero or, if any, negligibly low levels.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

First Embodiment

Figure 1:
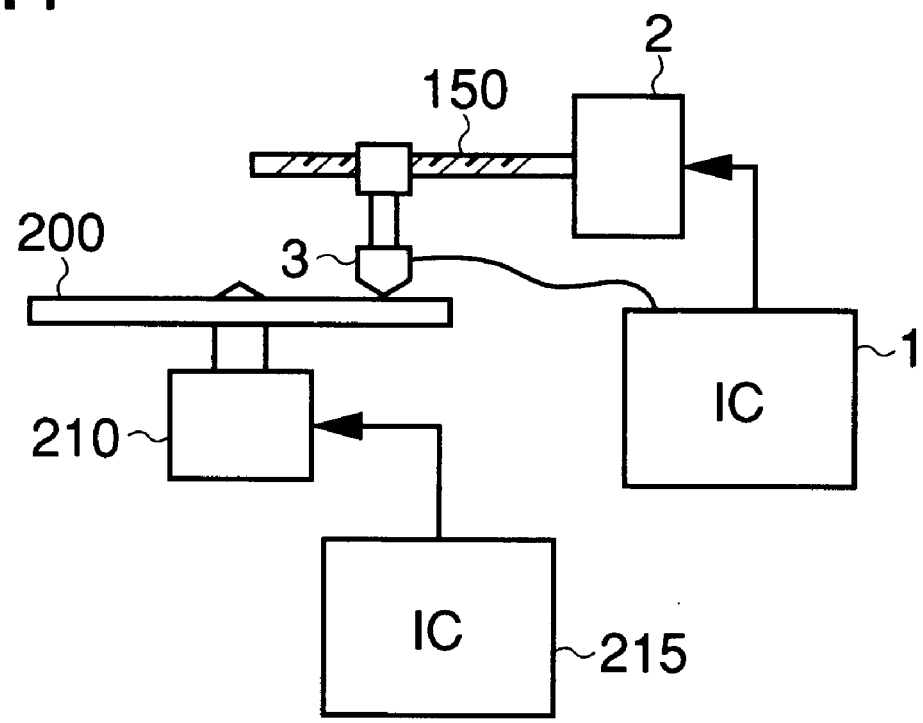
FIG. 1 is a diagram schematically showing the principal portion of a disk drive apparatus employing a semiconductor integrated circuit device according to the present invention.

The semiconductor integrated circuit device of a first embodiment of the present invention will be described with reference to the drawings. In FIG. 1, numeral 200 represents a floppy disk containing a magnetic disk; numeral 210 represents a rotating mechanism, including a motor, for rotating the floppy disk. Numeral 215 represents a semiconductor integrated circuit device provided with a servo circuit for controlling the driving of the motor included in the rotating mechanism 210. Numeral 3 represents a magnetic head. Numeral 150 represents a spindle for moving the magnetic head 3 in the direction of a radius of the disk (i.e. laterally in the figure). Numeral 2 represents a stepping motor for rotating the spindle 150. Numeral 1 represents a semiconductor integrated circuit device provided with circuits such as a circuit for driving the stepping motor 2, a circuit for processing a read-out signal received from the magnetic head 3, and a circuit for processing a to-be-written signal supplied from outside and supplying the processed signal to the magnetic head.

Figure 2:
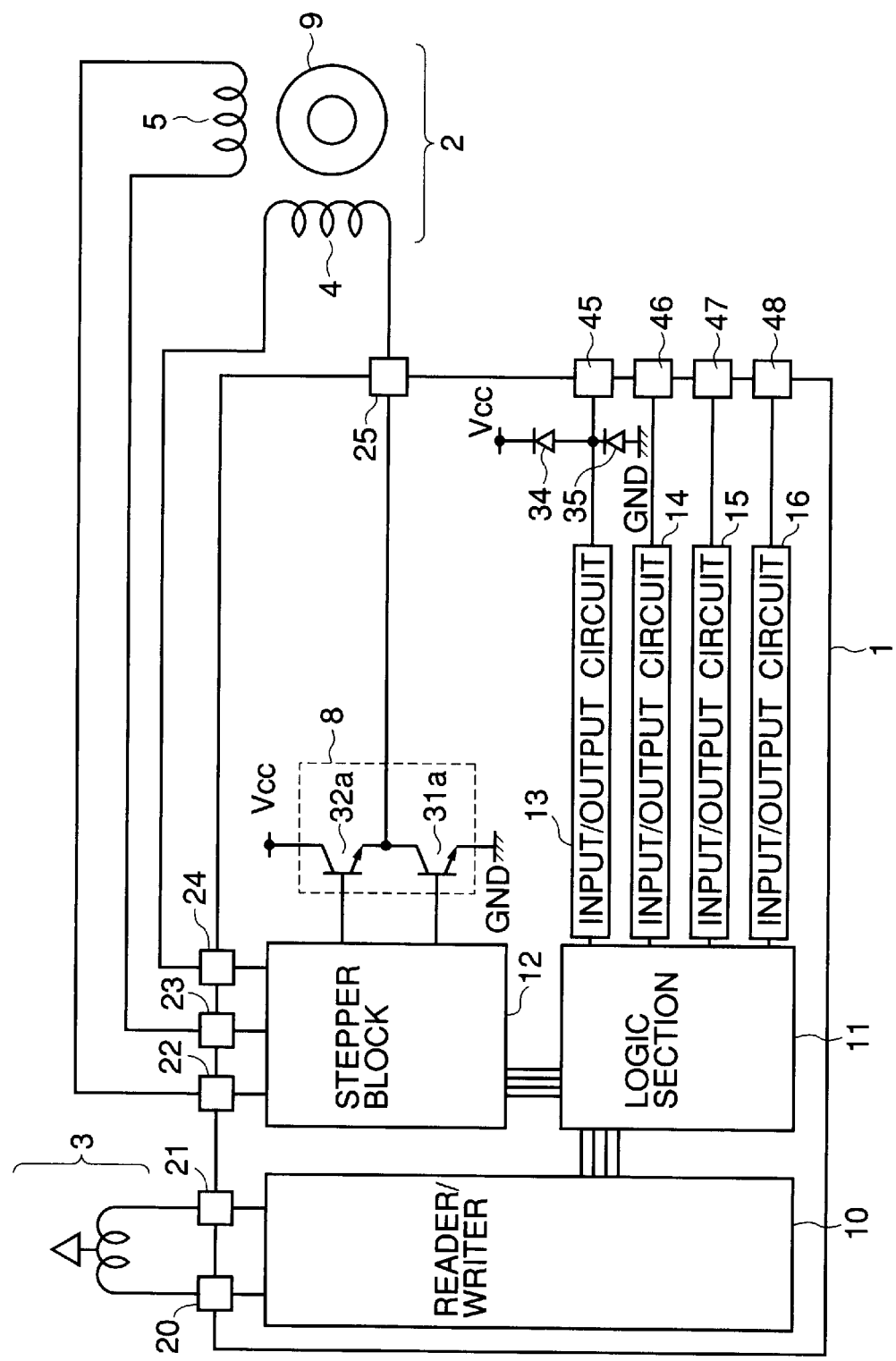
FIG. 2 is a block diagram of the semiconductor integrated circuit device of a first embodiment of the invention.

FIG. 2 is a block diagram showing the construction of the semiconductor integrated circuit device 1 shown in FIG. 1. This semiconductor integrated circuit device 1 consists of a reader/writer 10 for reading and writing data through the magnetic head 3 by use of BiCMOS devices, a stepper block (motor drive circuit) 12 for supplying an electric current to the stepping motor 2, a logic section 11 for controlling the reader/writer 10 and the stepper block 12, and input/output circuits 13 to 16 provided between the logic section 11 and input/output pads 45 to 48 of the semiconductor integrated circuit device 1 for receiving and outputting signals.

The reader/writer 10 is a circuit for processing a signal read out from the disk 200 and a signal to be written to the disk 200; that is, it on the one hand writes a signal to the disk 200 by sending the signal to the magnetic head 3 via pads 20 and 21, and on the other processes a signal read out from the disk 200 by the magnetic head 3. The read-out signal is supplied from the reader/writer 10 to the logic section 11, and then through one of the input/output circuits 14 to 16 (for example, 14) to the corresponding one of the pads 46 to 48 (for example, 46 in this case) for external output. On the other hand, the to-be-written signal received from outside is received at another of the input/output pads 46 and 48, and is supplied through the corresponding one of the input/output circuits 14 to 16 to the logic section 11, then through the reader/writer 10 to the magnetic head 3 so as to be recorded on the disk 200.

The stepper block 12 supplies electric currents to a two-phase stepping motor 2 via four pads 22 to 25, and thereby produces a rotating magnetic field in inductance coils 4 and 5 and rotates a rotor 9. The stepping motor 2 rotates the spindle 150, and thereby moves the magnetic head 3 in the direction of a radius of the disk. The coil 4 is connected to the pads 24 and 25, and the coil 5 is connected to the pads 22 and 23.

Between the stepper block 12 and the pad 25, an output circuit 8 is provided that is constructed as a push-pull circuit so that it can output a large current. The output circuit 8 consists of two NPN-type transistors 31a and 32a that are so connected as to form a push-pull circuit. The transistor 32a may be of the PNP type. The collector of the transistor 32a is connected to the power source voltage Vcc and its emitter is connected to the collector of the transistor 31a. The emitter of the transistor 31a is connected to ground (GND). The bases of the transistors 31a and 32a are connected to a control circuit 33a (see FIG. 3) so as to be controlled by a driver control signal.

Figure 3:
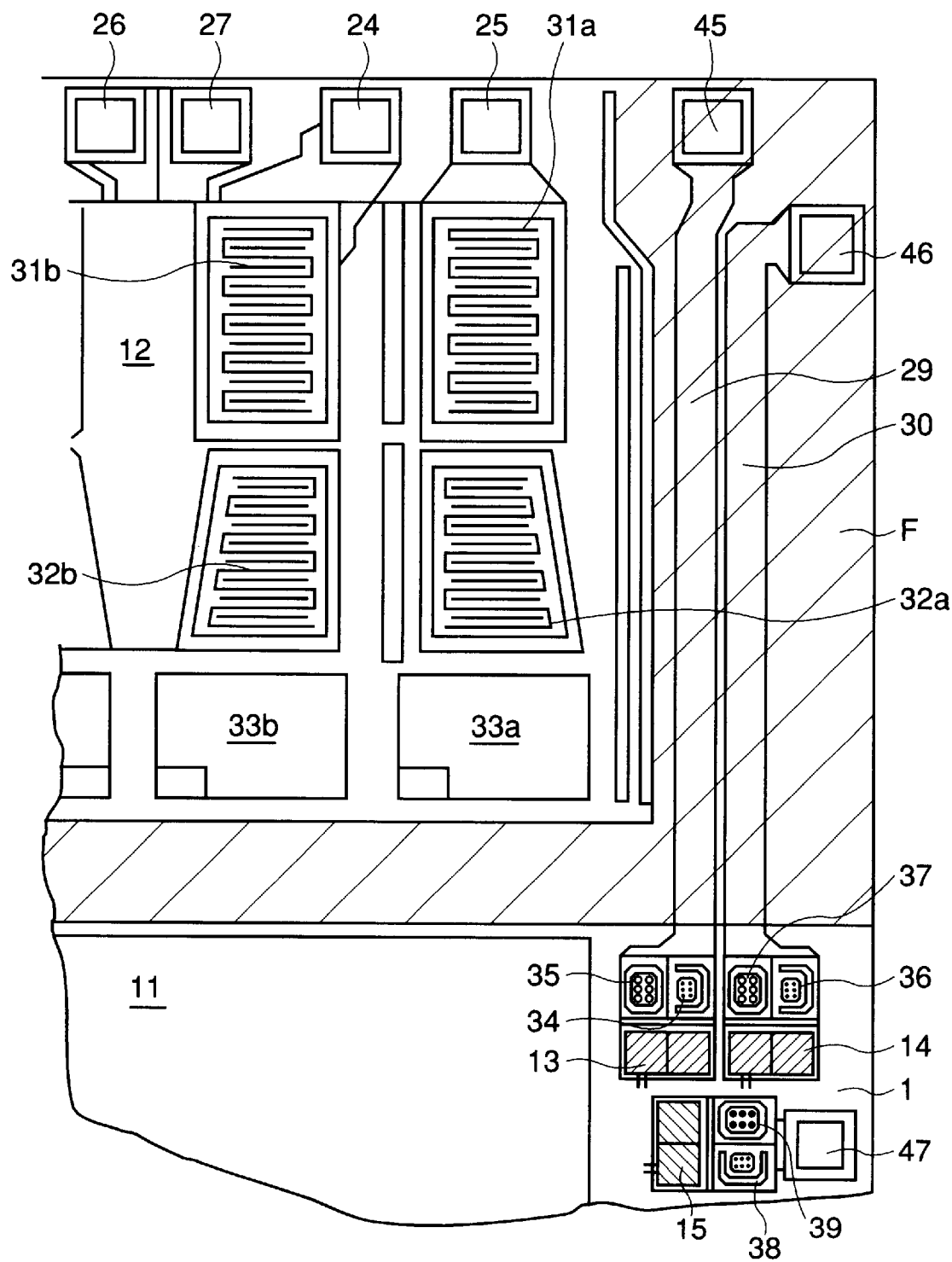
FIG. 3 is a diagram schematically showing the plan structure of the semiconductor integrated circuit device of the first embodiment.

The output pad 25 is connected to the node between the transistors 31a and 32a. As the transistors 31a and 32a are alternatively turned on and off, the direction of the current supplied to the coil switches between forward and backward. Although, in FIG. 2, the output circuit 8 is shown as a separate block from the stepper block 12, it is in reality provided within the stepper block 12 as shown in FIG. 3.

Also for the pad 24, a similar output circuit is provided; specifically, a transistor 32b (see FIG. 3) on the power source voltage (Vcc) side, a transistor 31b on the ground (GND) side, and a control circuit 33b are provided. Similarly, the pads 22 and 23 that are connected to the coil 5 are connected to transistors similar to those connected to the above-described pads 24 and 25.

The logic section 11 controls the reader/writer 10 and the stepper block 12. The logic section 11 receives and outputs signals from and to the outside of the semiconductor integrated circuit device 1 via the input/output circuits 13 to 16. Between the input/output circuit 13 and the pad 45, protection diodes 34 and 35 are provided for protection against destruction due to static electricity.

The cathode of the diode 34 is connected to the power source voltage (Vcc), and its anode is connected to the cathode of the diode 35. The anode of the diode 35 is connected to ground (GND). The input/output circuit 13 and the pad 45 are connected to the node between the diodes 34 and 35. When a positive surge voltage is applied to the pad 45 from outside, the diode 34 turns on, and, when a negative surge voltage is applied, the diode 35 turns on, both to alleviate the surge and thus protect the inside circuitry of the semiconductor integrated circuit device 1.

Figure 5:
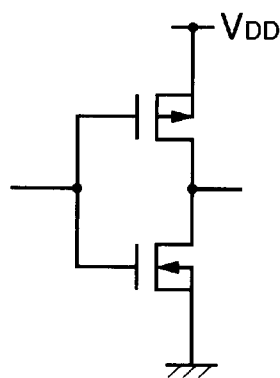
FIG. 5 is a diagram showing a practical example of the input/output circuit used in the first embodiment.

The pad 45 is used, for example, to receive a signal to control the stepping motor 2. Although not shown in the figure, similar protection diodes are provided also between the input/output circuits 14 to 16 and the pads 46 to 48, respectively. The input/output circuits 13 to 16 are composed of, for example, CMOS transistors, as shown in FIG. 5.

In this embodiment, as shown in FIG. 3, the protection diodes 34 and 35 are formed away from the pad 45, and the protection diodes 36 and 37 are formed away from the pad 46. The pads 45 and 46 are provided within a prohibited region F (described later) shown as a hatched area in the figure. The protection diodes 34 to 37 are provided outside the prohibited region F. The pad 45 and the diodes 34 and 35 are connected via an aluminum deposit 29, and the pad 46 and the diodes 36 and 37 are connected via an aluminum deposit 30.

The prohibited region F is a region where leak currents like the previously mentioned $I_1$ and $I_2$ (see FIG. 6) may cause malfunctioning, and its extent varies with the capacity of the transistors 31a to 31d and other factors. In an ordinary LSI (large-scale integrated circuit), the protection diodes 34 to 37 need to be placed more than about 500 μm away from the stepper block 12. This helps reduce the hfe (forward current amplification factor) of a parasitic device (like the parasitic transistor 60 in FIG. 6) sufficiently to minimize the leak currents $I_1$ and $I_2$.

The input/output circuit 13 is provided adjacent to the protection diodes 34 and 35, and the input/output circuit 14 is provided adjacent to the protection diodes 36 and 37. On the other hand, a pad 47, protection diodes 38 and 39, and an input/output circuit 15 are formed outside the prohibited region F. This pad 47, however, may be provided inside the prohibited region F, if necessary.

Figure 6:
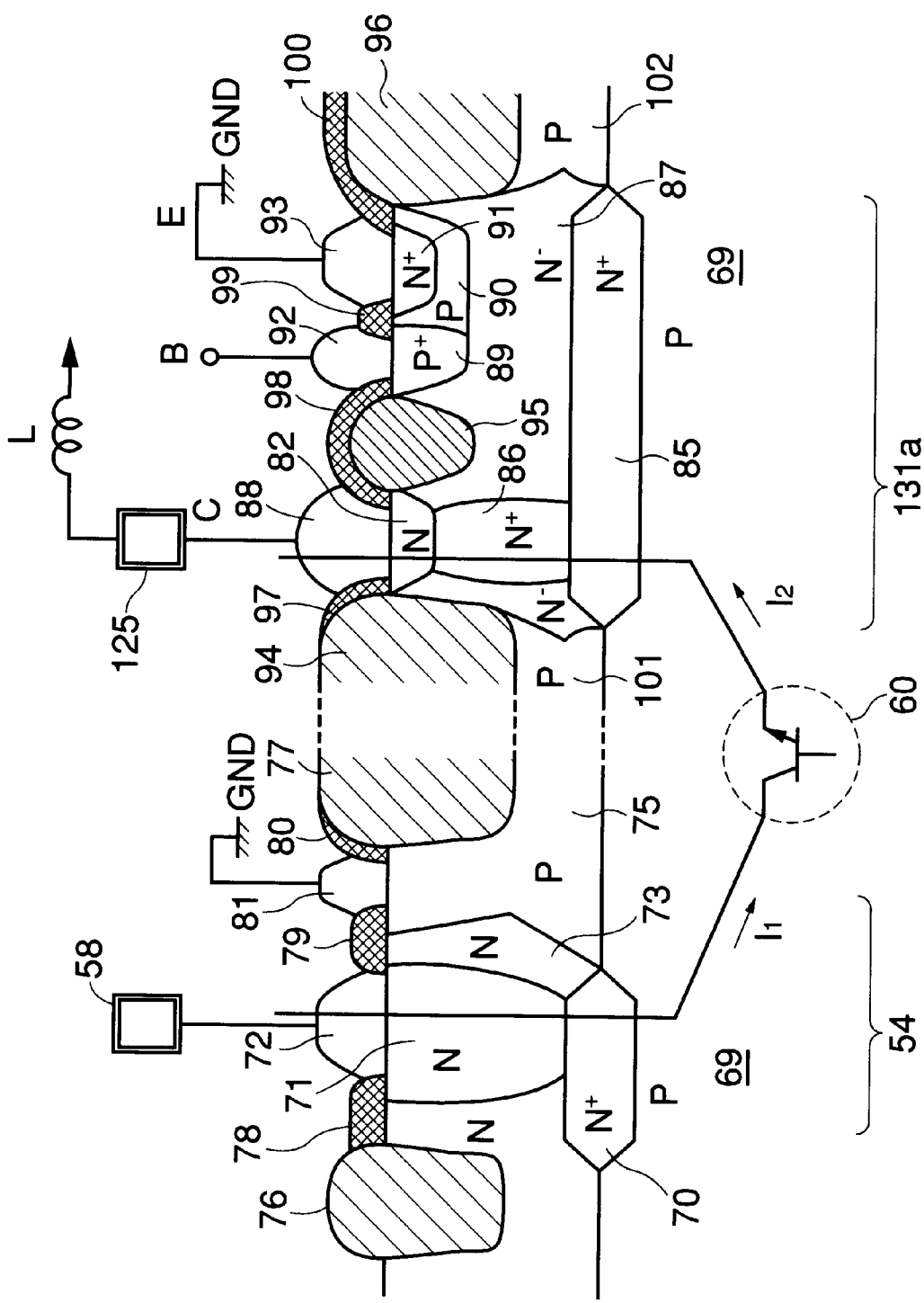
FIG. 6 is a cross section of a conventional semiconductor integrated circuit device, for explaining the problem it presents.

In the semiconductor integrated circuit device of this embodiment, the transistors of the output circuit and the protection diodes are formed by use of devices and materials similar to those used in the conventional example shown in FIG. 6.

In FIG. 3, such components as are found also in FIG. 2 are identified with the same symbols. The pads 26 and 27 are provided for other purposes. The transistors 31a to 31d and 32a to 32d have comb-shaped electrodes to secure as large current capacity as possible. The control circuits 33a to 33d, having small device areas, do not produce unduly large leak currents $I_1$ and $I_2$ even if they are provided near the transistors 31a to 31d, and thus do not cause malfunctioning.

Even if the pads of all the protection circuits (composed of diodes) are provided, like the pad 47, outside the prohibited region F, it is still possible to prevent the leak currents $I_1$ and $I_2$ from causing malfunctioning. However, in that case, the prohibited region F cannot be used effectively, and thus it is inevitable to increase the chip area of the semiconductor integrated circuit device.

By contrast, in the embodiment under discussion, where the protection diodes 34 to 37 are provided outside the prohibited region F and the pads 45 and 46 are provided inside the prohibited region F, the prohibited region F can be used effectively, and thus the increase in the chip area can be reduced to a minimum. Driving of a large current is required not only in a driver for a stepping motor, but also in an interface driver for sending out a signal through a long cable, and in similar drivers. Accordingly, the present invention is applicable not only to a driver for a motor, but also to an interface driver.

In general, even if a circuit including an inductance component is connected to a driver, it is possible to prevent leak currents by placing large-area devices such as protection diodes away from the driver. In other words, if there are other large-area devices than the protection diodes 34 to 37, they need to be placed outside the prohibited region F to minimize leak currents.

Second Embodiment

Figure 4:
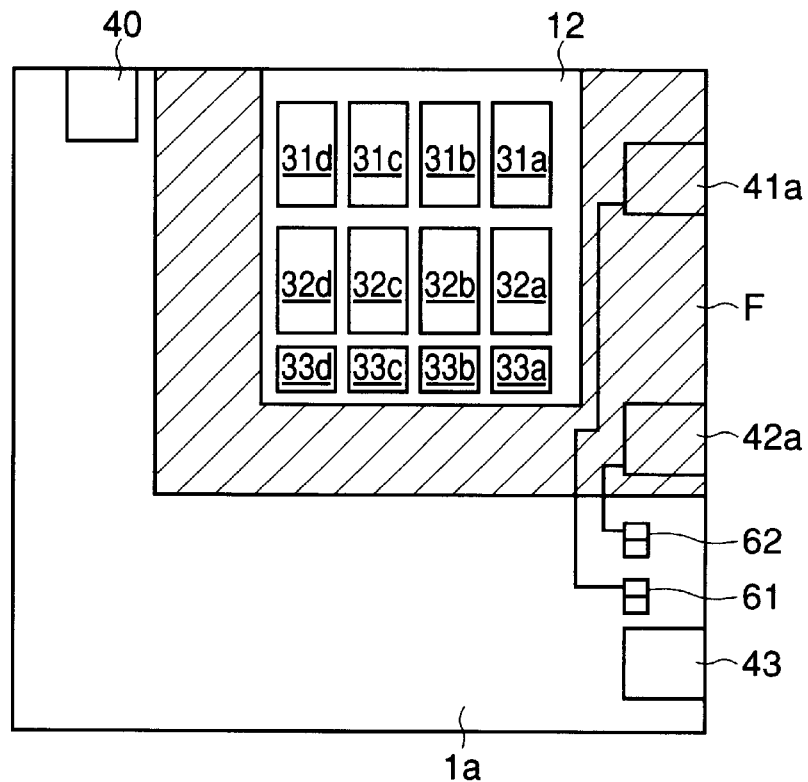
FIG. 4 is a diagram schematically showing the plan structure of the semiconductor integrated circuit device of a second embodiment of the invention.

A second embodiment of the present invention will be described with reference to FIG. 4. FIG. 4 is a diagram showing the device arrangement in the principal portion of the semiconductor integrated circuit device 1a of the second embodiment. In the above-described semiconductor integrated circuit device 1 (see FIG. 3) of the first embodiment, for example, both the protection diodes 34 and 35 and the input/output circuit 13, both connected to the pad 45, are provided outside the prohibited region F. By contrast, in the second embodiment, the pad and the input/output circuit are provided in a region, such as the regions labeled as 41a and 42a in the figure, within the prohibited region F, and only the corresponding protection diodes 61 and 62 are provided outside the prohibited region F. In FIG. 4, such components as are found also in FIG. 3 are identified with the same symbols.

The pads provided in the regions 41a and 42a respectively and the protection diodes 61 and 62 provided outside the prohibited region F are respectively connected via an aluminum deposit. The protection diodes 61 and 62 are also connected to the input/output circuits provided in the regions 41a and 42a respectively. The protection diodes 61 and 62 are each formed in the same manner as the previously-mentioned protection diodes 34 and 35 (see FIGS. 2 and 3).

Although the input/output circuit is provided inside the prohibited region F, thanks to its small device area (the area of the transistors shown in FIG. 5), it produces only a negligibly small leak current, if any. In a case where the transistor 31a is formed as shown in FIG. 6, it is possible to eliminate the leak current by composing the input/output circuit with P-channel MOSFETs. The semiconductor integrated circuit device 1a is also provided with a reader/writer 10 (see FIG. 2) and a logic section 11 (see FIG. 2).

As described above, in this embodiment, as in the first embodiment described previously, it is possible to reduce leak currents and thereby stabilize the operation of the semiconductor integrated circuit device 1a. Moreover, it is also possible to use the prohibited region F effectively and thereby reduce the chip area.

Although both of the above embodiments deal with a floppy disk drive apparatus, it is possible to construct a semiconductor integrated circuit device for a hard disk drive apparatus in a similar manner and thereby prevent leak currents. Furthermore, the present invention is applicable also to a semiconductor integrated circuit device for a servo circuit for driving the disk-rotating motor 210 shown in FIG. 1.

What is claimed is:

1. A semiconductor integrated circuit device for use in a disk drive apparatus, comprising:
   a first pad to be connected to a motor coil;
   an output circuit, including an output transistor whose emitter is connected to ground and whose collector is connected to the first pad, for supplying an electric current to the motor coil via the first pad;
   a second pad for receiving and outputting signals; and
   a protection diode whose cathode is connected to the second pad and whose anode is connected to ground for protection against surge input,
   wherein the second pad is disposed a first distance away from the output transistor and the protection diode is disposed a second distance away from the output transistor, wherein the first distance is less than the second distance, thereby reducing a chance of malfunction due to a parasitic transistor occurring in the semiconductor integrated circuit device.

2. A semiconductor integrated circuit device as claimed in claim 1, wherein the second distance is more than about 500 μm.

3. A semiconductor integrated circuit device for use in a disk drive apparatus, comprising:
- a first pad to be connected to a motor coil;
- an output circuit, including an output transistor whose emitter is connected to ground and whose collector is connected to the first pad, for supplying an electric current to the motor coil via the first pad;
- a drive circuit for applying a drive signal to a base of the output transistor;
- a second pad, formed near the output circuit, for receiving a signal from outside and outputting a signal to outside;
- a control circuit for controlling the drive circuit in accordance with a signal received via the second pad; and
- a protection diode whose cathode is connected to the second pad and whose anode is connected to ground for protection against surge input,
- wherein the second pad is disposed a first distance away from the output transistor and the protection diode is disposed a second distance away from the output transistor, wherein the first distance is less than the second distance, thereby reducing a chance of malfunction due to a parasitic transistor occurring in the semiconductor integrated circuit device.

4. A semiconductor integrated circuit device as claimed in claim 3, wherein an input/output circuit is additionally provided between the second pad and the control circuit, the input/output circuit being formed, together with the second pad, near the output circuit.

5. A semiconductor integrated circuit device as claimed in claim 3, wherein the second distance is more than about 500 μm.

6. A semiconductor integrated circuit device as claimed in claim 4, wherein the input/output circuit is composed of CMOS transistors having small device areas.

7. A semiconductor integrated circuit device comprising:
- a driver for supplying an electric current to a circuit including an inductance,
- a pad for receiving or outputting a signal from or to outside, and
- a protection diode connected to the pad,
- wherein the pad is disposed a first distance away from the driver and the protection diode is disposed a second distance away from the driver, and wherein the first distance is less than the second distance.

8. A semiconductor integrated circuit device as claimed in claim 7, wherein the driver is an interface driver for sending out a signal through a cable.

9. A semiconductor integrated circuit device as claimed in claim 7, wherein the driver has a pair of transistors that are so connected as to form a push-pull circuit and one end of the inductance is connected to a node between those transistors.

10. A semiconductor integrated circuit device as claimed in claim 7, wherein the second distance is more than about 500 μm.

11. A disk drive apparatus having a semiconductor integrated circuit device, said semiconductor integrated circuit device comprising:
- a first pad to be connected to a motor coil;
- an output circuit, including an output transistor whose emitter is connected to ground and whose collector is connected to the first pad, for supplying an electric current to the motor coil via the first pad;
- a drive circuit for applying a drive signal to a base of the output transistor;
- a second pad, formed near the output circuit, for receiving a signal from outside and outputting a signal to outside;
- a control circuit for controlling the drive circuit in accordance with a signal received via the second pad; and
- a protection diode whose cathode is connected to the second pad and whose anode is connected to ground for protection against surge input,
- wherein the second pad is disposed a first distance away from the output transistor and the protection diode is disposed a second distance away from the output transistor, wherein the first distance is less than the second distance, thereby reducing a chance of malfunction due to a parasitic transistor occurring in the semiconductor integrated circuit device.

12. A disk drive apparatus as claimed in claim 11, wherein the motor coil is a coil of a stepping motor for moving a magnetic head.

13. A disk drive apparatus as claimed in claim 11, wherein the motor coil is a coil of a motor for rotating a magnetic disk.

14. A semiconductor integrated circuit device as claimed in claim 11, wherein the second distance is more than about 500 μm.

15. A semiconductor integrated circuit device for use in a motor drive apparatus, comprising:
- a first pad to be connected to a motor coil;
- an output circuit, including an output transistor whose emitter is connected to ground and whose collector is connected to the first pad, for supplying an electric current to the motor coil via the first pad;
- a second pad for receiving and outputting signals; and
- a protection diode whose cathode is connected to the second pad and whose anode is connected to ground for protection against surge input,
- wherein the second pad is disposed a first distance away from the output transistor and the protection diode is disposed a second distance away from the output transistor, wherein the first distance is less than the second distance, thereby reducing a chance of malfunction due to a parasitic transistor occuring in the semiconductor integrated circuit device.

16. A semiconductor integrated circuit device for use in a motor drive apparatus, comprising:
- a first pad to be connected to a motor coil;
- an output circuit, including an ouput transistor whose emitter is connected to ground and whose collector is connected to the first pad, for supplying an electric current to the motor coil via the first pad;
- a drive circuit for applying a drive signal to a base of the output transistor;
- a second pad, formed near the output circuit, for receiving a signal from outside and outputting a signal to outside;
- a control circuit for controlling the drive circuit in accordance with a signal received via the second pad; and
- a protection diode whose cathode is connected to the second pad and whose anode is connected to ground for protection against surge input,
- wherein the second pad is disposed a first distance away from the output transistor and the protection diode is disposed a second distance away from the output transistor, wherein the first distance is less than the second distance, thereby reducing a change of malfunction due to a parasitic transistor occuring in the semiconductor integrated circuit device.

17. A semiconductor integrated circuit device as claimed in claim 16, wherein an input/output circuit is additionally provided between the second pad and the control circuit, the input/output circuit being formed, together with the second pad, near the output circuit.

18. A semiconductor integrated circuit device as claimed in claim 17, wherein the input/output circuit is composed of CMOS transistors having small device areas.

19. A motor drive apparatus having a semiconductor integrated circuit device, said semiconductor integrated circuit device comprising:

a first pad to be connected to a motor coil;

an output circuit, including an output transistor whose emitter is connected to ground and whose collector is connected to the first pad, for supplying a signal from outside and outputting a signal to outside;

a control circuit for controlling the drive circuit in accordance with a signal received via the second pad; and a protection diode whose cathode is connected to the second pad and whose anode is connected to ground for protection against surge input, wherein the second pad is disposed a first distance away from the output transistor and the protection diode is disposed a second distanec away from the output transistor, wherein the first distance is less than the second distance, thereby reducing a chance of malfunction due to a first parasitic transistor occuring in the semiconductor integrated circuit device.

20. A disk drive apparatus as claimed in claim 19, wherein the motor coil is a coil of a stepping motor for moving an object.

21. A disk drive apparatus as claimed in claim 19, wherein the motor coil is a coil of a motor for rotating an object.

22. A semiconductor integrated circuit device as claimed in claim 15, wherein the second distance is more than about 500 $\mu$m.

23. A semiconductor integrated circuit device as claimed in claim 16, wherein the second distance is more than about 500 $\mu$m.

24. A semiconductor integrated circuit device as claimed in claim 19, wherein the second distance is more than about 500 $\mu$m.

* * * * *